United States Patent
Lim et al.

(10) Patent No.: US 8,248,844 B2
(45) Date of Patent: Aug. 21, 2012

(54) PHASE-CHANGE MEMORY DEVICE

(75) Inventors: Ki-won Lim, Suwon-si (KR); Won-ryul Chung, Yongin-si (KR); Young-ran Kim, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/347,021

(22) Filed: Jan. 10, 2012

(65) Prior Publication Data

US 2012/0106244 A1 May 3, 2012

Related U.S. Application Data

(63) Continuation of application No. 11/902,727, filed on Sep. 25, 2007, now Pat. No. 8,111,545.

(30) Foreign Application Priority Data

Sep. 26, 2006 (KR) .................. 10-2006-0093727

(51) Int. Cl.
G11C 11/00 (2006.01)
(52) U.S. Cl. .......... 365/163; 365/100; 365/148; 257/2; 977/754
(58) Field of Classification Search ............ 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 5,982,656 A | 11/1999 | Cutter et al. | |
| 6,667,900 B2 * | 12/2003 | Lowrey et al. | 365/171 |
| 6,768,665 B2 * | 7/2004 | Parkinson et al. | 365/113 |
| 2002/0041947 A1 * | 4/2002 | Chin et al. | 428/64.4 |
| 2003/0123284 A1 * | 7/2003 | Lowrey et al. | 365/175 |
| 2005/0052904 A1 | 3/2005 | Cho et al. | |
| 2006/0072370 A1 * | 4/2006 | Kuh et al. | 365/232 |
| 2006/0151849 A1 * | 7/2006 | Czubatyj | 257/467 |
| 2007/0297221 A1 * | 12/2007 | Philipp et al. | 365/163 |

FOREIGN PATENT DOCUMENTS

| | | |
|---|---|---|
| KR | 10-2005-0025730 A | 3/2005 |
| KR | 10-2005-0046041 A | 5/2005 |

OTHER PUBLICATIONS

Ahn, et al., "A Nonvolatile Memory Based on Reversible Phase Changes Between *fcc* and *hcp*", IEEE Electron Device Letters, vol. 26, No. 5, pp. 286-288, (May 2005).

* cited by examiner

*Primary Examiner* — Alexander Sofocleous
*Assistant Examiner* — Harry W Byrne
(74) *Attorney, Agent, or Firm* — Lee & Morse, P.C.

(57) ABSTRACT

A phase-change memory device and its firing method are provided. The firing method of the phase-change memory device includes applying a writing current to phase-change memory cells, identifying a state of the phase-change memory cells after applying the writing current, and applying a firing current, in which an additional current is added to the writing current, to the phase-change memory cells in accordance with the state.

12 Claims, 8 Drawing Sheets

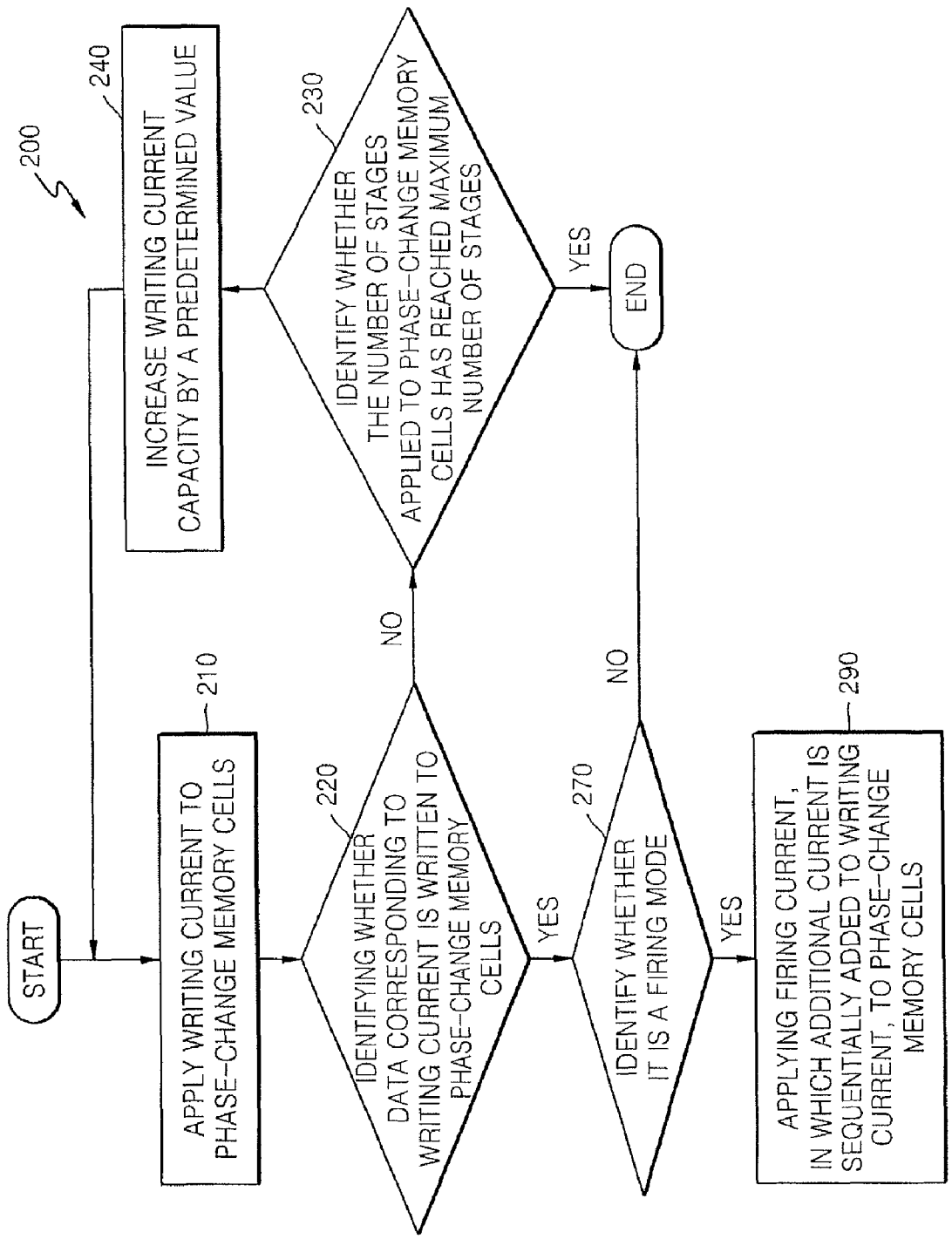

PHASE-CHANGE MEMORY DEVICE

CROSS REFERENCE TO RELATED APPLICATION

This is a continuation application based on application Ser. No. 11/902,727, filed Sep. 25, 2007, now U.S. Pat. No. 8,111,545, the entire contents of which is hereby incorporated by reference.

BACKGROUND OF THE INVENTION

1. Field of the Invention

Embodiments relate to a firing method for a phase-change memory device, and more particularly, to a firing method which performs a firing operation by using a firing current in which an additional current is added to a writing current after a writing operation is performed, and a phase-change memory device.

2. Description of the Related Art

After phase-change memory cells are formed, amorphous, face centered cubic (FCC), and hexagonal closed packed (HCP) states coexist in phase-change materials included in the phase-change memory cells. The phase-change material typically exhibits a relatively low resistance in the crystalline state, which is typically defined as a "set" state or logic "0", and a relatively high resistance in the amorphous state, which is typically defined as a "reset" state or logic "1."

In order to improve a transition property of the phase-change materials, the phase-change materials may be in a uniform FCC state. An operation of applying high energy to realize the phase-change materials in a uniform FCC state is referred to as firing.

A firing operation may be performed by applying a firing current having high current capacity to the phase-change memory cell. Accordingly, sufficient heat may be generated on a contact interface between the phase-change materials, and thus, the phase-change materials may be arranged to be in a uniform FCC state. Thus, the phase-change materials may have a uniform resistance distribution.

In a conventional firing method, the same firing current may be applied to all phase-change memory cells. Therefore, the phase-change materials may not be arranged in a uniform FCC state using the conventional firing method.

FIGS. 1A through 1C illustrate phase-change memory cells after a preset current has been applied to the phase-change memory cells.

Referring to FIGS. 1A through 1C, after the preset firing current has been applied, a programmable volume of the phase-change memory cells (PGM) in a phase change material such as a chalcogenide alloy, e.g., a germanium-antimony tellurium (GST) alloy, may vary in accordance with a resistance size of a bottom electrode contact (BEC). FIG. 1A illustrates a phase change memory cell 100A when the preset firing current is higher than an appropriate firing current, resulting in a physical defect. FIG. 1C illustrates a phase change memory cell 100C when the preset firing current is lower than an appropriate firing current, resulting in a phase-transition not being properly performed. FIG. 1B illustrates a phase-change memory cell 100B when the preset firing current is appropriate.

SUMMARY OF THE INVENTION

Embodiments are directed to a firing method and a resultant structure, which overcome one or more of the disadvantages of the related art.

It is therefore a feature of an embodiment to perform a firing operation by using a firing current in which an additional current is added to a writing current after a writing operation is performed.

It is therefore another feature of an embodiment to provide a phase-change memory device including a control unit performing a firing operation using a firing current composed of an additional current added to a writing current.

At least one of the above and other features and advantages may be realized by providing a firing method for a phase-change memory device, the method including applying a writing current to phase-change memory cells, identifying a state of the phase-change memory cells after applying the writing current, and applying a firing current, in which an additional current is added to the writing current, to the phase-change memory cells in accordance with the state.

The writing current may be a current that can write data to each of the phase-change memory cells. Applying the firing current may include adding the additional current to a minimum writing current, wherein the minimum writing current is a minimum current that can write data to each of the phase-change memory cells. Applying the firing current may include repeatedly applying the firing current to each of the phase-change memory cells. Applying the firing current may include repeatedly applying the firing current having the same current capacity to each of the phase-change memory cells.

Applying the writing current may include sequentially increasing a writing current applied to the phase-change memory cells. The method may further include identifying whether data corresponding to the writing current is written to the phase-change memory cells, wherein applying the writing current includes applying the writing current to the phase-change memory cells to which data has not been written.

Applying the firing current may include applying a firing voltage having a voltage level that is higher than that of a reset voltage to the phase-change memory cells, wherein the reset voltage is a voltage that can reset the phase-change memory cells to a reset state.

The method may include determining the additional current.

Applying the firing current may include simultaneously applying the firing current to a plurality of the phase-change memory cells. Applying the writing current may include simultaneously applying the writing current to a plurality of the phase-change memory cells. Applying the firing current may include simultaneously applying the firing current to the phase-change memory cells included in a same bank.

The writing current may be a reset current which resets the phase-change memory cells to a reset state. Applying the reset current may include sequentially increasing the reset current in a plurality of stages. The method may include identifying whether the phase-change memory cells are in a reset state, wherein applying the firing current is performed when the phase-change memory cells are in a reset state. The method may include identifying whether the phase-change memory cells are in a reset state after each stage of the reset current is applied to the phase-change memory cells, wherein applying the firing current is performed when all phase-change memory cells are in a reset state.

The method may include identifying whether the number of stages applied to the phase-change memory cells has reached the maximum number of stages, when the phase-change memory cells are not all in a reset state, and applying a current that is larger by a predetermined value than that of a previous stage, when the number of stages applied to the phase-change memory cells has not reached the maximum number of stages.

Applying the firing current may be performed on the phase-change memory cells that are not in a reset state. Identifying a state of the phase-change memory cells may include determining that the phase-change memory cells are in a reset state when data written to the phase-change memory cells can be sensed and a voltage level of the sensed data is larger than a sensing standard voltage level.

The method may include changing the sensing standard voltage level which senses data written to the phase-change memory cells, and wherein identifying a state of the phase-change memory cells includes comparing the voltage level of the sensed data with the changed sensing standard voltage level. Changing the sensing standard voltage level may include decreasing the sensing standard voltage level by a predetermined value.

At least one of the above and other features and advantages may be realized by providing a phase-change memory device, including a PRAM cell array including a number of phase-change memory cells, a driver configured to apply a writing current and a firing current to the phase-change memory cells, and a controlling unit configured to identify a state of the phase-change memory cells, and to control the writing current and the firing current, wherein the controlling unit is configured to control the driver to apply a firing current, in which an additional current is added to the writing current, to the phase-change memory cells in accordance with the state.

The controlling unit may include a firing controlling unit configured to control a firing driver, and a writing controlling unit configured to identify whether the data is written to the phase-change memory cells and to activate the firing controlling unit when the data has been written to the phase-change memory cells. The phase-change memory device may include a sense amplifier configured to read data from the phase-change memory cells and transmit the data to the writing controlling unit.

BRIEF DESCRIPTION OF THE DRAWINGS

The above and other features and advantages of the present invention will become more apparent by describing in detail exemplary embodiments thereof with reference to the attached drawings, in which:

FIG. 2 illustrates a flowchart of a firing method according to an embodiment of the present invention;

DETAILED DESCRIPTION OF EMBODIMENTS

Figure 1A:
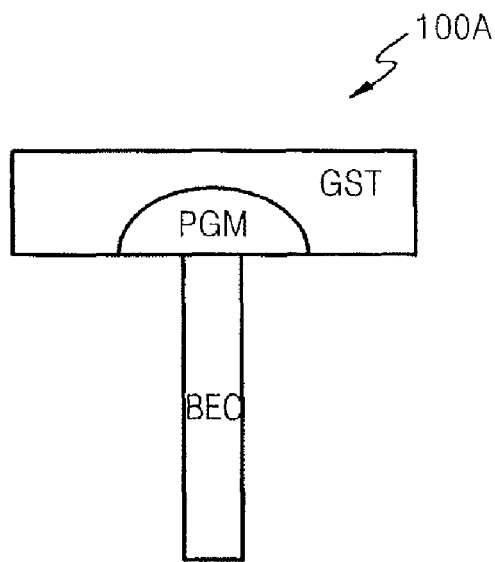
FIGS. 1A through 1C illustrate phase-change memory cells after a preset firing current has been applied to the phase-change memory cells.
Figure 1B:
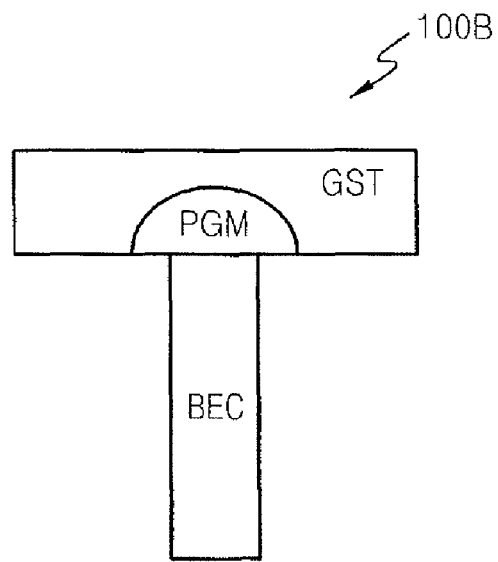
Figure 1C:
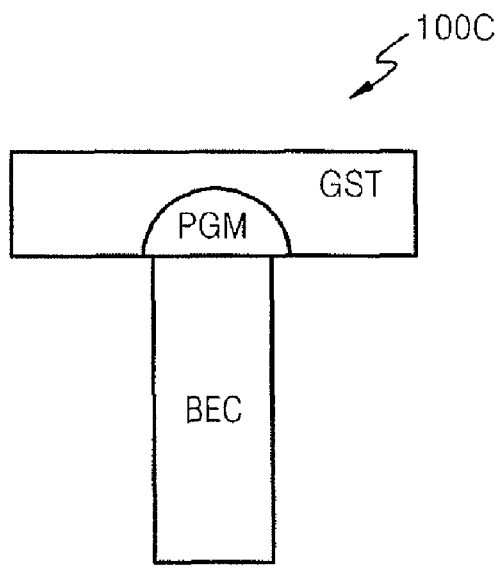

Korean Patent Application No. 10-2006-0093727, filed on Sep. 26, 2006, in the Korean Intellectual Property Office, and entitled: "Phase-Change Memory Device and Firing Method for the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

As discussed below, a writing current of a firing method according to the present invention may be a reset current which may reset phase-change memory cells to a reset state or a set current which may set phase-change memory cells to a set state.

FIG. 2 illustrates a flowchart of a firing method 200 according to an embodiment of the present invention.

Referring to FIG. 2, the firing method 200 may include applying a writing current to the phase-change memory cells in operation 210 and applying a firing current, in which an additional current may be added to the writing current, to the phase-change memory cells in operation 290.

In operation 290, the firing current may include an additional current added to the writing current, wherein the writing current is a current that may write data to each phase-change memory cell. The writing current may be different for each phase-change memory cell, and the firing current may be larger than the writing current. Thus, in the firing method according to an embodiment of the present invention, the firing current may be different for each phase-change memory cell. More specifically, since an additional current may be added to the writing current for each of the phase-change memory cells, the firing current may be different for each of the phase-change memory cells and larger than the writing current.

In operation 290, the firing current may include an additional current added to the minimum writing current which may write data to each of the phase-change memory cells. Here, the minimum writing current may be defined as the smallest current among writing currents which may properly write data to the phase-change memory cells.

In operation 290, the firing current may be repeatedly applied to each of the phase-change memory cells. Thus, the firing method according to an embodiment of the present invention may improve a firing efficiency with respect to the phase-change memory cells.

In operation 290, a firing current having the same current may be repeatedly applied to each of the phase-change memory cells. That is, a firing current having the same current may be repeatedly applied to one phase-change memory cell. In this case, a firing current having different values of current may be repeatedly applied to each different phase-change memory cell.

In operation 290, a firing current may be simultaneously applied to a plurality of phase-change memory cells. Further-more, a firing current may be applied to the phase-change memory cells included in the same bank. Also, in operation 210, a writing current may be simultaneously applied to a plurality of the phase-change memory cells. Accordingly, the firing method according to an embodiment of the present invention may reduce the time required for applying a writing current or a firing current.

In operation 210, the writing current may be sequentially increased. For example, the writing current may include a plurality of stages in which current is sequentially increased. In this case, in operation 290, a firing current, in which an additional current is added to a current of the plurality of stages which may reset each of the phase-change memory cells to a reset state, may be applied to the phase-change memory cells.

The firing method according to an embodiment of the present invention may further include identifying whether data corresponding to the writing current is written to the phase-change memory cells in operation 220. In this case, in operation 210, the writing current may be applied only to the phase-change memory cells to which data is not written. For example, in the firing method according to an embodiment of the present invention, whether the phase-change memory cells are in a reset state is identified, and only when the phase-change memory cells are in a reset state may a firing current be applied.

The firing method according to an embodiment of the present invention may further include identifying whether the number of the stages applied to the phase-change memory cells has reached a maximum number of stages in operation 230. Operation 230 may be performed when the phase-change memory cells are not in a reset state as determined in operation 220.

The firing method according to an embodiment of the present invention may further include increasing a writing current, e.g., a reset current, by a predetermined value in operation 240, when operation 230 determines that the number of the stages applied to the phase-change memory cells has not reached the maximum number of stages. If operation 230 determines that the number of the stages applied to the phase-change memory cells has reached the maximum number of states, the firing method may be ended.

The firing method according to an embodiment of the present invention may further include identifying whether it is in a firing mode in operation 270. In this case, operation 290 may be performed only when operation 270 determines the firing method is in a firing mode. If operation 270 determines the firing method is not in a firing mode, the firing method may be ended.

In operation 290, a firing voltage having a higher voltage level than that of a reset voltage level may be applied to the phase-change memory cells, wherein the reset voltage level is a voltage level which may reset the phase-change memory cells to a reset state.

Figure 3:
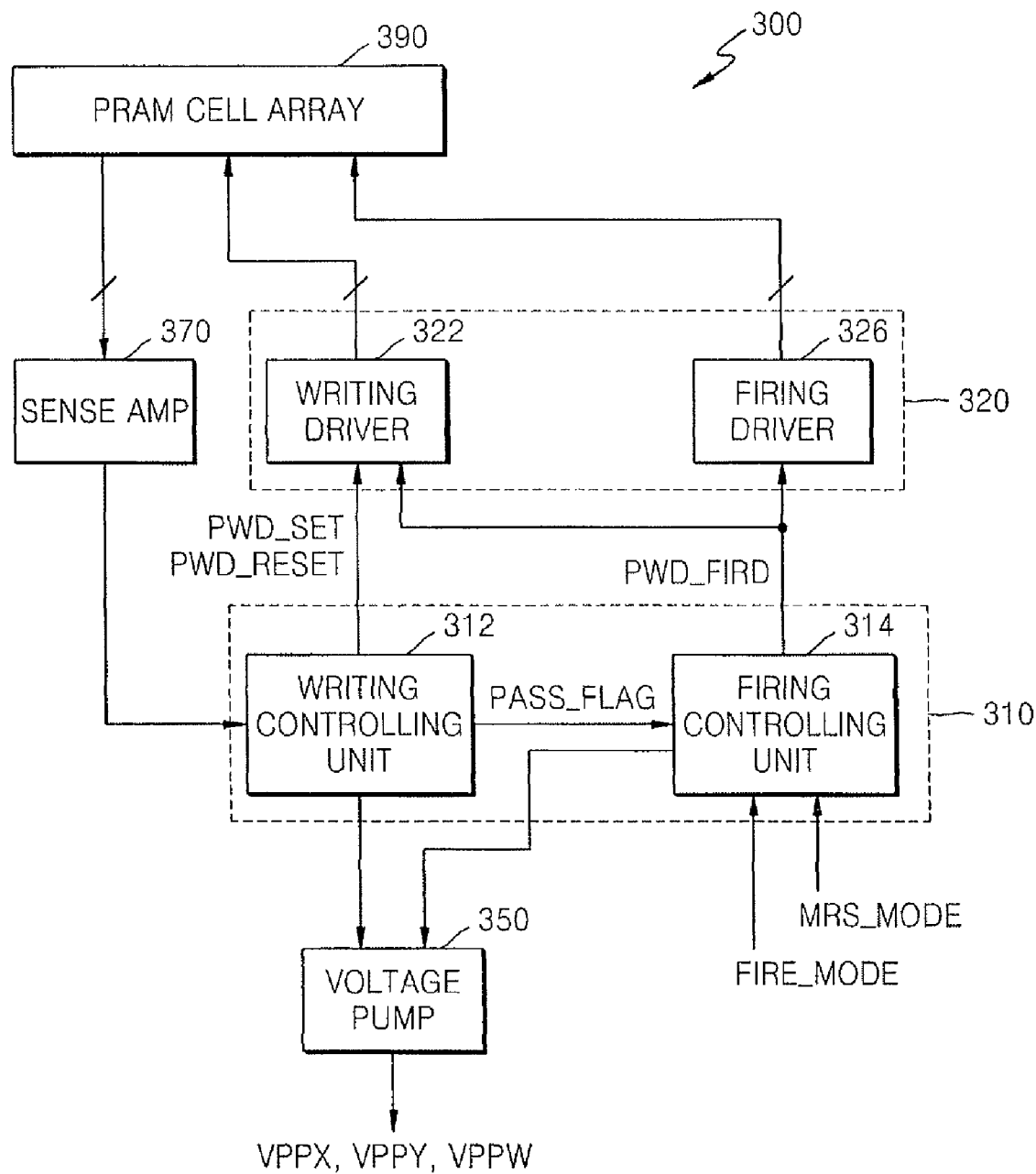
FIG. 3 illustrates a block diagram of a phase-change memory device according to an embodiment of the present invention.

FIG. 3 illustrates a block diagram of a phase-change memory device 300 according to an embodiment of the present invention.

Referring to FIG. 3, the phase-change memory device 300 according to an embodiment of the present invention may include a phase-change random access memory (PRAM) cell array 390, a driver 320, and a controlling unit 310.

The PRAM cell array 390 may include a number of the phase-change memory cells. The driver 320 may apply a writing current and a firing current to the phase-change memory cells in the PRAM cell array 390. The controlling unit 310 may identify whether data corresponding to the writing current is written to the phase-change memory cells, and may control the writing current and the firing current.

When data is written to the phase-change memory cells, the controlling unit 310 may control the driver 320 so that the firing current, in which an additional current is added to the writing current, is applied to the phase-change memory cells in the PRAM cell arrays 390.

The driver 320 may include a writing driver 322 and a firing driver 326. In a writing mode where data is written to the phase-change memory cells, the writing driver 322 may apply a writing current to the phase-change memory cells. In a firing mode, the firing driver 326 may apply an additional current to the phase-change memory cells.

The controlling unit 310 may include a firing controlling unit 314 and a writing controlling unit 312. The writing controlling unit 312 may output a reset control signal PWD_RESET or a set control signal PWD_SET to the writing driver 322. The writing controlling unit 312 may identify whether data is written to the phase-change memory cells. When data is written to the phase-change memory cells, the firing controlling unit 314 may be activated by a flag PASS_FLAG output from the writing controlling unit 312 to the firing controlling unit 314. In turn, the firing controlling unit 314 may a firing differential voltage PWD_FIRD to the firing driver 326 and the writing driver 322. In particular, when the firing controlling unit 314 receives a firing mode signal FIRE_MODE, the firing controlling unit 314 may output the firing control signal PWD_FIRD to the firing driver 326 and the writing driver 322. When the firing controlling unit 314 receives a memory reset mode signal MRS_MODE, the firing controlling unit 314 may not output the firing control signal PWD_FIRD.

The phase-change memory device 300 may further include a sense amplifer 370. The sense amplifier 370 may read data of the phase-change memory cells and transmit the data to the writing controlling unit 312.

The phase-change memory device 300 may further include a voltage pump 350. The voltage pump 350 may output operation voltages VPPX, VPPY, and VPPW of the phase-change memory device 300 in a writing mode and a firing mode received from the controlling unit 310.

Figure 4:
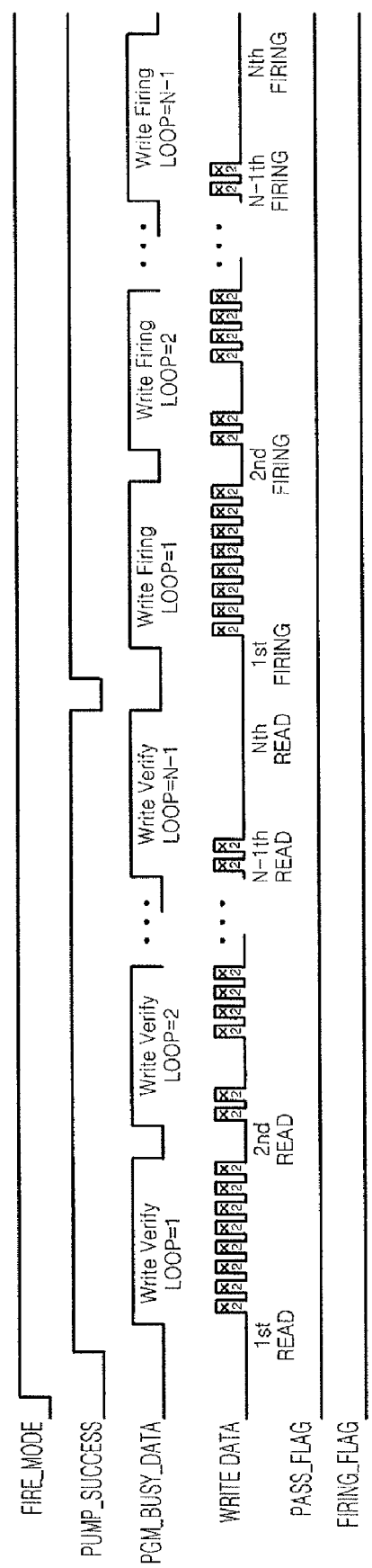
FIG. 4 illustrates a timing diagram of operations of a firing method and a phase-change memory device according to an embodiment of the present invention.

FIG. 4 illustrates a timing diagram of operations of a firing method and a phase-change memory device according to an embodiment of the present invention.

In the firing method illustrated in FIG. 4, a firing current may be applied to phase-change memory cells to which a writing current has been applied. Write firing loops are performed by the same manner as the write verify loops. Each of the write firing loops uses the firing current that includes an additional current added to the writing current used in the corresponding write verify loop.

The firing method and the phase-change memory device according to the current embodiment of the present invention may be operated in response to the firing mode signal FIRE_MODE. Write Verify LOOP may indicate that an operation of applying writing current that is sequentially increased is repeated. In a first loop, a writing current may be applied to all phase-change memory cells. In a second loop, a writing current that has been increased by a predetermined value may be applied only to the phase-change memory cells to which data has not been written. A writing current that is sequentially increased may be applied until data is written to all phase-change memory cells. Then, when data is written to all phase-change memory cells, a firing current may be applied thereto. Here, the firing current may include an additional current added to the writing current, wherein the writing current may write data to each of the phase-change memory cells. Accordingly, a different firing current may be applied to each of the phase-change memory cells. In addition, in order to apply a firing current, the voltage pump may be continuously operated. In order to do so, in the firing method and the phase-change memory device according to an embodiment of the present invention, a pump control signal PUMP_SUCCESS may be continuously activated during firing.

Figure 5:
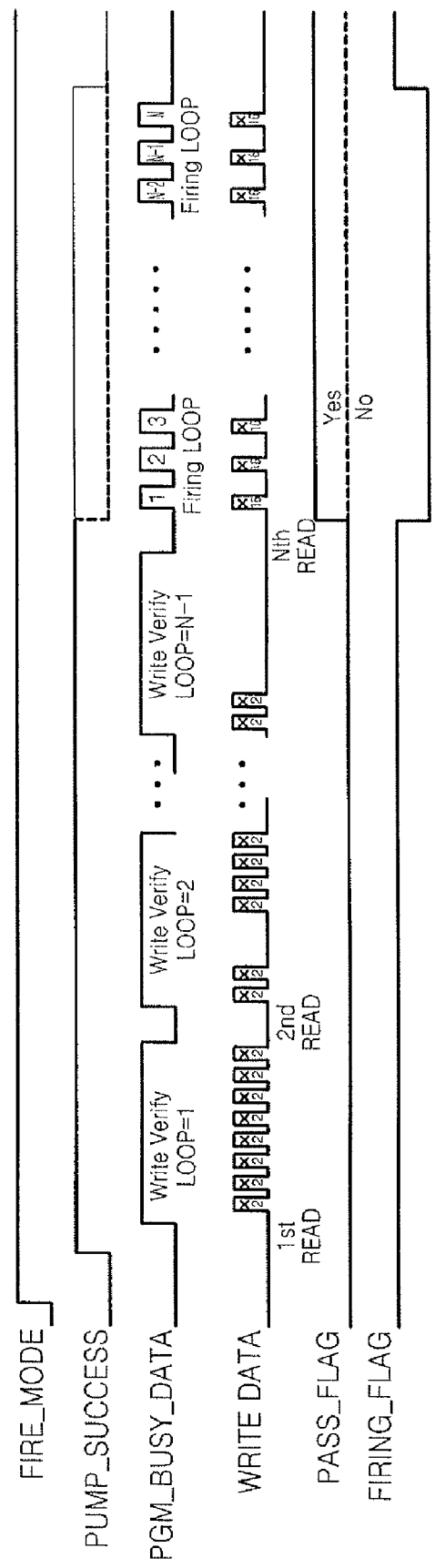
FIG. 5 illustrates a timing diagram of operations of a firing method and a phase-change memory device according to another embodiment of the present invention.

FIG. 5 illustrates a timing diagram of operations of a firing method and a phase-change memory device according to another embodiment of the present invention.

Unlike in the firing method illustrated in FIG. 4, in the firing method illustrated in FIG. 5, firing current in each of the firing loops is applied to all phase-change memory cells as indicated in '16' of WRITE DATA in FIG. 5. However, '2' of WRITE DATA in FIG. 4 indicates that firing current is applied to some of phase-change memory cells.

The firing method and the phase-change memory device according to an embodiment of the present invention may be operated in response to the firing mode signal FIRE_MODE. The Write Verify LOOP may operate as discussed above in connection with FIG. 4. Then, when data is written to all phase-change memory cells, a firing current may be applied thereto. Here, the firing current may include an additional current added to the writing current, wherein the writing current may write data to each of the phase-change memory cells. Here, the firing current may be continuously and repeatedly applied. Accordingly, a different firing current may be applied to each of the phase-change memory cells. In order to repeatedly apply the firing current, a charge pump may be continuously operated. In order to do so, in the firing method and the phase-change memory device according to an embodiment of the present invention, the pump control signal PUMP_SUCCESS may be activated during firing when the PASS_FLAG is yes and deactivated when the PASS_FLAG is no.

Figure 6:
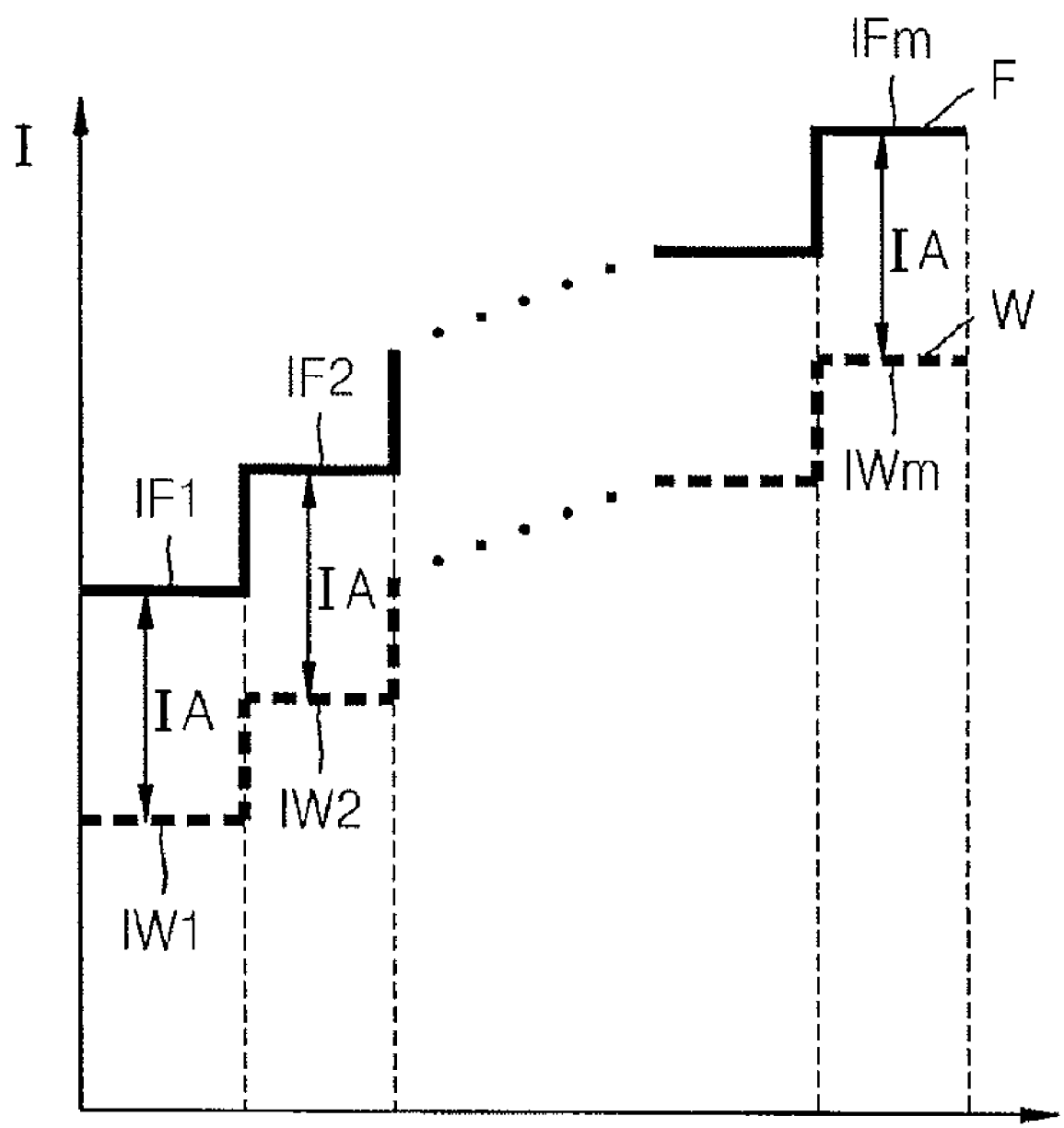
FIG. 6 illustrates a graph of a writing current and a firing current in a firing method and a phase-change memory device according to an embodiment of the present invention.

FIG. 6 illustrates a graph of a writing current and a firing current in a firing method and a phase-change memory device according to an embodiment of the present invention. The writing current may include a plurality of stages IW1-IWm that sequentially increase. The firing current may also include a plurality of stages IF1-IFm that sequentially increase. The stages IF1-IFm of the firing current each may have a current that is larger by additional current IA than a corresponding one of the stages IW1-IWm of the writing current.

Here, each stage IW1-IWm may be applied to each of the phase-change memory cells. On the other hand, the stages IF1-IFm of the same firing current may be repeatedly applied to one phase-change memory cell.

Figure 7:
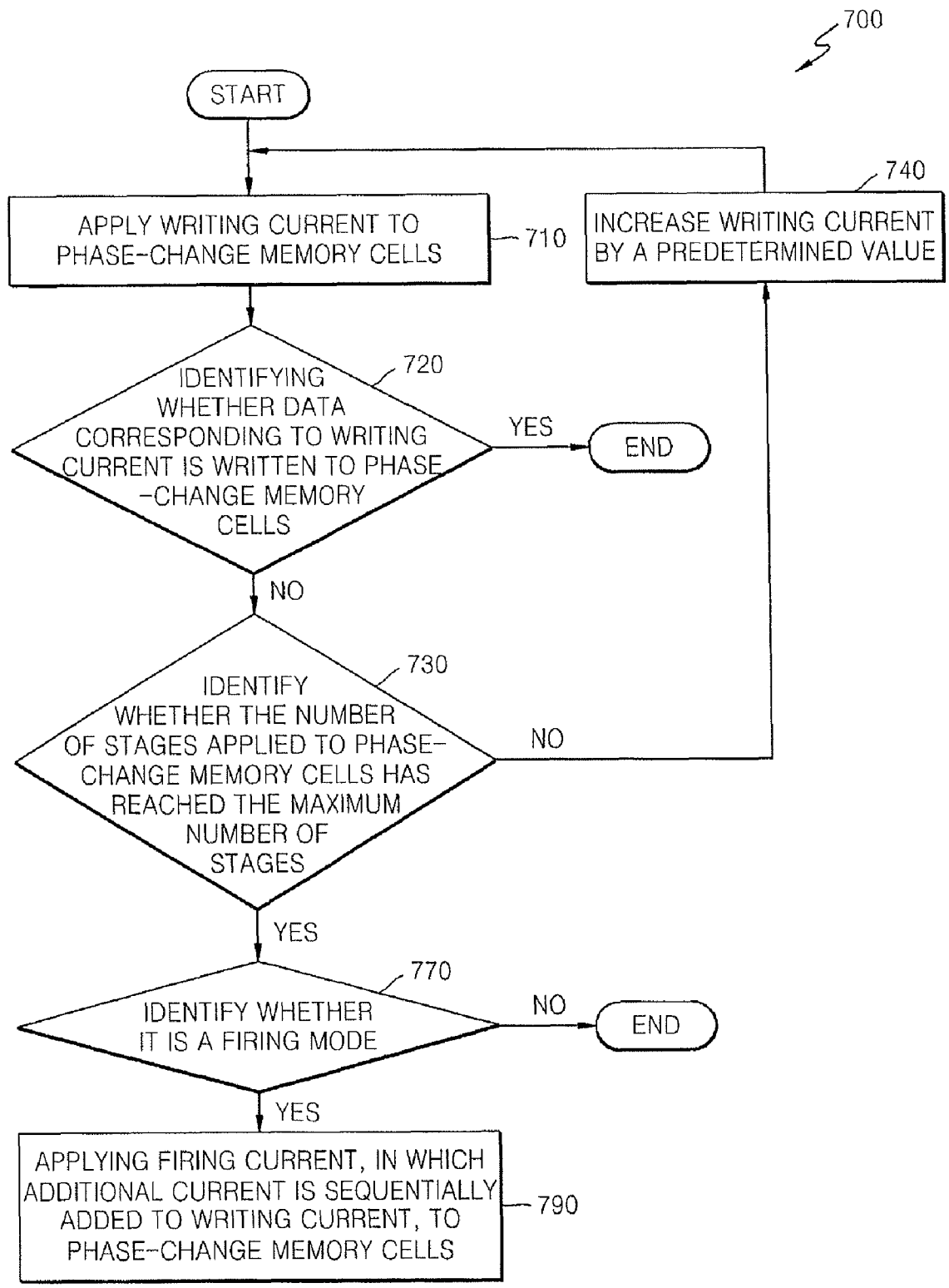
FIG. 7 illustrates a flowchart of a firing method according to another embodiment of the present invention.

FIG. 7 illustrates a flowchart of a firing method 700 according to another embodiment of the present invention.

Unlike the firing method 200 according to an embodiment of the present invention, in the firing method 700 according to another embodiment of the present invention, a firing operation may be performed only for the phase-change memory cells to which data is not properly written.

In particular, after a writing current has been applied to phase-change memory cells in operation 710, operation 720 may identify whether data corresponding to a writing current has been written to the phase-change memory cells. If operation 720 determines data has been written, the firing operation 700 may be ended. If operation 720 determines data has not been written, then operation 730 may identify whether the number of stages applied to the phase-change memory cells has reached a maximum number of stages.

If operation 730 determines that the number of stages has not reached the maximum number of stages, a writing current may be increased by a predetermined value in operation 740, and the firing method 700 may return to operation 710. If operation 730 determines that the number of stages has reached the maximum number of stages, operation 770 determines whether the firing method 700 is in a firing mode. If not, the firing method 700 may end. If the firing method 700 is in the firing mode, the firing current, in which additional current is sequentially added to the writing current, may be applied to the phase-change memory cells in operation 790.

Figure 8:
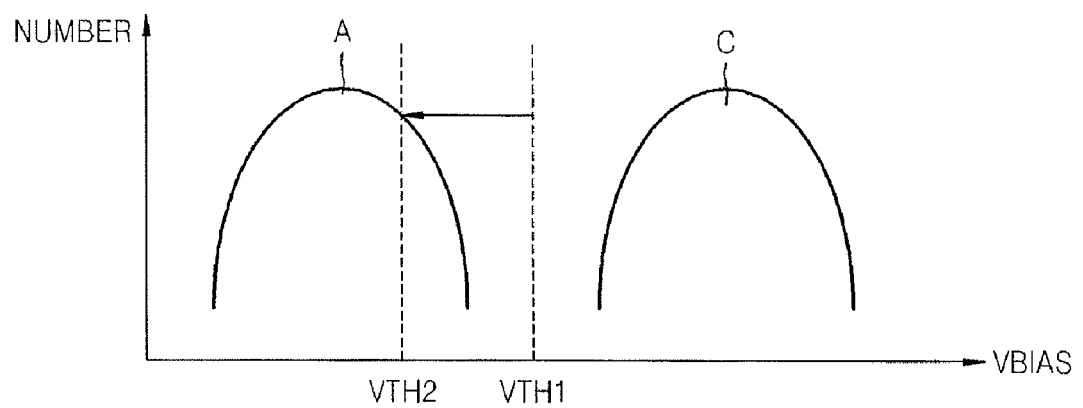
FIG. 8 illustrates a diagram for explaining the firing method according to another embodiment of the present invention.
Figure 9:
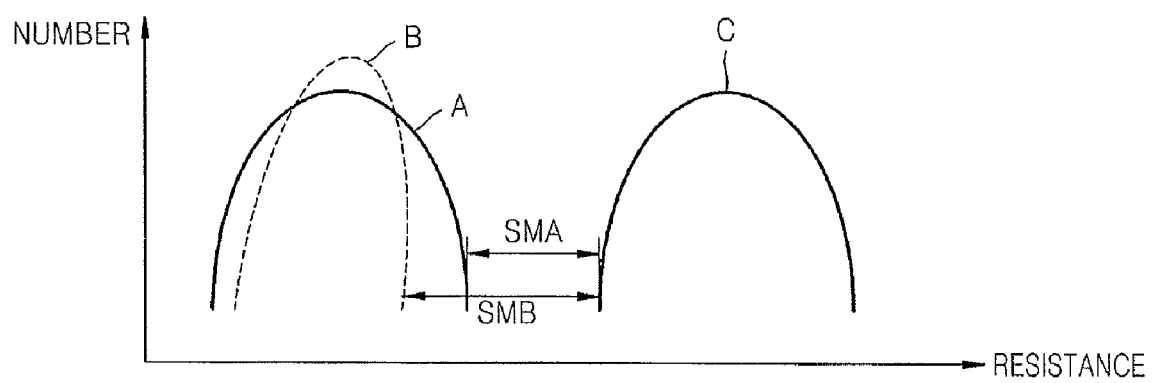
FIG. 9 illustrates a diagram of an effect of a firing method according to an embodiment of the present invention.

FIGS. 8 and 9 illustrate diagrams for explaining the firing method 700. In the firing method 700, in order to identify whether data is written to the phase-change memory cells, a sensing standard voltage may be decreased from VTH1 to VTH2. Then, when a sensing voltage of the phase-change memory cell is lower than VTH2, the data may be determined not to have been written. Accordingly, in the firing method 700 according to another embodiment of the present invention, a firing operation may be selectively performed for the phase-change memory cells having a low resistance.

In FIGS. 8 and 9, A and C represent a set resistance distribution of the phase-change memory cells before the firing method 700 according to an embodiment of the present invention is performed. In FIG. 9, B represents a set resistance distribution of the phase-change memory cells after the firing method 700 according to an embodiment of the present invention is performed.

As can be seen in FIG. 9, a sensing margin SMB after the firing method 700 is performed may be larger than a sensing margin SMA before the firing method 700 is performed.

As described above, the firing method and the phase-change memory device according to the present invention consider a process variation of the phase-change memory cells and apply an optimum firing current to the phase-change memory cells.

As used herein, the singular forms "a," "an" and "the" are intended to include the plural forms as well, unless the context clearly indicates otherwise. It will be further understood that the terms "comprises," "comprising," "includes," and "including" specify the presence of stated features, integers, steps, operations, elements, components, etc., but do not preclude the presence or addition thereto of one or more other features, integers, steps, operations, elements, components, groups, etc.

Unless otherwise defined, all terms used herein, including technical and scientific terms, have the same meaning as commonly understood by one of ordinary skill in the art. It will be further understood that terms such as those defined in commonly used dictionaries should be interpreted as having a meaning that is consistent with their meaning in the context of the relevant art, and not in an idealized or overly formal sense unless expressly so defined herein.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A phase-change memory device, comprising:
a PRAM cell array including a number of phase-change memory cells;
a writing driver configured to apply a writing current to the phase-change memory cells in response to a first signal;
a firing driver configured to apply a firing current to the phase-change memory cells in response to a second signal;

a writing controlling unit configured to identify whether a data is written to the phase-change memory cells and to output the first signal to the writing driver; and a firing controlling unit configured to output the second signal to the firing driver in response to a third signal;

wherein the amount of the firing current is equal to the amount of the sum of an additional current and the writing current.

2. The phase-change memory device of claim 1, wherein the first signal is configured to set a writing mode to write a data to each of the phase-change memory cells, in which the writing current is a reset current which the phase-change memory cells to a reset state.

3. The phase-change memory device of claim 1, wherein the second signal is configured to control a filing mode, in which includes identifying whether a number of stages of the writing current is applied to the phase-change memory cells has reached a maximum number of stages, when the phase-change memory cells are not all in a reset state, and applying the additional current that is larger than that of a previous stage, when the number of stages applied to the phase-change memory cells has not reached the maximum number of stages.

4. The phase-change memory device of claim 1, wherein the third signal is configured to set a filing mode, in which includes identifying whether the phase-change memory cells are in a reset state and applying the firing current only when the phase-change memory cells are in a reset state or not.

5. A phase-change memory device, comprising:
a PRAM cell array including a number of phase-change memory cells;
a writing driver configured to apply a writing current to the phase-change memory cells in response to a first signal;
a firing driver configured to apply a firing current to the phase-change memory cells in response to a second signal;
a writing controlling unit configured to identify whether a data is written to the phase-change memory cells and to output the first signal to the writing driver; and
a firing controlling unit configured to output the second signal to the firing driver in response to a third signal;
wherein the third signal is generated when a number of a writing stage reaches a predetermined value, a data has been written to the phase-change memory cells or an operation mode of the phase-change memory device is in a firing mode.

6. The phase-change memory device of claim 5, wherein the first signal is configured to set a writing mode to write the data to each of the phase-change memory cells, in which the writing current is a reset current which the phase-change memory cells to a reset state.

7. The phase-change memory device of claim 5, wherein the second signal is configured to control the firing mode, in which includes identifying whether the number of stages of the writing current is applied to the phase-change memory cells has reached a maximum number of stages, when the phase-change memory cells are not all in a reset state, and applying a current that is larger than that of a previous stage, when the number of stages applied to the phase-change memory cells has not reached the maximum number of stages.

8. The phase-change memory device of claim 5, wherein the third signal is configured to set the filing mode, in which includes identifying whether the phase-change memory cells are in a reset state and applying the firing current only when the phase-change memory cells are in a reset state or not.

9. A phase-change memory device, comprising:
a PRAM cell array including a number of phase-change memory cells; and
a driver configured to apply a first current or a second current to the phase-change memory cells in response to a signal;
wherein the first current is enough to form each all of the phase-change memory cells into amorphous and face centered cubic states and the first current is bigger than the second current.

10. The phase-change memory device of claim 9, wherein the signal is generated when a number of stages of the writing current is applied to the phase-change memory cells has reached a predetermined value, a data has been written to the phase-change memory cells or an operation mode of the phase-change memory device is in firing mode.

11. The phase-change memory device of claim 9, wherein the second current is a reset current which the phase-change memory cells to a reset state.

12. The phase-change memory device of claim 9, wherein the driver configured to apply a third current which the phase-change memory cells to a set state.

* * * * *